United States Patent
Frantz et al.

(10) Patent No.: US 7,368,911 B2
(45) Date of Patent: May 6, 2008

(54) METHOD FOR TESTING A SUPERCONDUCTOR UNDER INCREASED CURRENT LOAD IN A SERIES-PRODUCED AND ACTIVELY SHIELDED SUPERCONDUCTING NMR MAGNET

(75) Inventors: Wolfgang Frantz, Karlsruhe (DE); Robert Schauwecker, Zurich (CH)

(73) Assignee: Bruker Biospin GmbH, Rheinstetten (DE)

( * ) Notice: Subject to any disclaimer, the term of this patent is extended or adjusted under 35 U.S.C. 154(b) by 144 days.

(21) Appl. No.: 11/455,765

(22) Filed: Jun. 20, 2006

(65) Prior Publication Data

US 2008/0084207 A1 Apr. 10, 2008

(30) Foreign Application Priority Data

Jun. 23, 2005 (DE) .................. 10 2005 029 153

(51) Int. Cl.
*G01V 3/00* (2006.01)
(52) U.S. Cl. ....................... 324/307; 324/309
(58) Field of Classification Search ........ 324/300–322; 335/216, 399; 505/100, 211, 220, 230, 704, 505/705, 879, 887
See application file for complete search history.

(56) References Cited

U.S. PATENT DOCUMENTS

| | | | |
|---|---|---|---|
| 4,630,881 A | 12/1986 | Kumpitsch | |
| 6,727,699 B2 * | 4/2004 | Kasten | 324/318 |
| 6,753,748 B1 | 6/2004 | Schlenga | |
| 6,777,938 B2 * | 8/2004 | Schlenga et al. | 324/322 |
| 6,816,046 B1 | 11/2004 | Varney | |
| 6,972,652 B2 | 12/2005 | Frantz | |
| 6,987,436 B2 * | 1/2006 | Frantz | 335/216 |
| 7,157,999 B2 * | 1/2007 | Kasten | 335/216 |
| 2005/0068033 A1 | 3/2005 | Frantz | |
| 2006/0061361 A1 * | 3/2006 | Westphal | 324/318 |

* cited by examiner

*Primary Examiner*—Brij Shrivastav
(74) *Attorney, Agent, or Firm*—Paul Vincent

(57) ABSTRACT

A method for testing a new superconducting wire involves charging an actively shielded magnet coil configuration which comprises a first partial region which can be superconductingly short-circuited using an additional switch. A superconductor to be tested under increased current load is used in this first partial region, thereby preventing superconductor in the second partial region from being subjected to this increased current load. Operating currents are determined for both partial regions that have the desired excess current in the first partial region, with the overall field $B_0$ only slightly differing from the standard operating field of the magnet coil configuration. The operating currents are adjusted through initial charging of the overall magnet coil configuration, thereby taking into consideration the inductive coupling between the partial regions and after closing of the additional switch, by continued charging or discharging in the second partial region only. The method permits inexpensive testing of a superconductor in a series-produced NMR magnet under NMR conditions.

16 Claims, 2 Drawing Sheets

METHOD FOR TESTING A SUPERCONDUCTOR UNDER INCREASED CURRENT LOAD IN A SERIES-PRODUCED AND ACTIVELY SHIELDED SUPERCONDUCTING NMR MAGNET

This application claims Paris Convention priority of DE 10 2005 029 153.8 filed Jun. 23, 2005 the complete disclosure of which is hereby incorporated by reference.

BACKGROUND OF THE INVENTION

The invention concerns a method for testing a new superconducting wire through charging an actively shielded magnet coil configuration (20) comprising a first partial region (21) which can be superconductingly short-circuited using an additional switch (23). A superconductor is used in this first partial region (21), which is to be tested under increased current load without subjecting the superconductor in the second partial region (22) to increased current load. Both partial regions (21, 22) have associated operating currents, wherein the first partial region shows the desired excess current and the overall field $B_0$ differs only slightly from the standard operating field of the magnet coil configuration. These operating currents are adjusted through initial charging of the overall magnet coil configuration (20), thereby taking into consideration the inductive coupling between the partial regions (21, 22), and after closing the additional switch (23), through continuation of charging or discharging processes only in the second partial region (22). In this manner, the superconductor can be tested in a series-produced NMR magnet under NMR conditions and in an inexpensive fashion.

One essential problem in the construction of a superconducting NMR (nuclear magnetic resonance) magnet with maximum temporal field stability is the proper loading of the superconducting wire in the magnet. The NMR magnet should be as small and compact as possible to reduce costs. In order to achieve this, the superconducting wire (superconductor) must be loaded with a maximum current. However, the current must not be excessive, since otherwise the resistance of the superconductor, which cannot be completely eliminated in an actual superconductor, and the associated current reduction in the magnet, i.e. the magnetic field drift, would become excessive. The magnetic field drift of NMR magnets is defined, as is the field strength itself, relative to the resonance frequency of the hydrogen nucleus (proton), which, in turn, is proportional to the magnetic field. The specific maximum admissible field drift of NMR magnets is on the order of magnitude of 0.01 ppm/h. This would be a specific drift of 8 Hz/h for an 800 MHz magnet. As can be shown by simple calculation, a superconducting NMR magnet having this specification cannot be operated at a current that corresponds to the critical current of the superconductor used. According to a generally accepted definition, the critical current is reached when the voltage drop across one centimeter of the superconductor is 0.1 pV. As the magnetic field in which the superconductor is located increases, the critical current decreases. With a conductor length of typically 100 km wound in a highest-field magnet, operation of a conductor length of 1 km in a magnetic field region in which the magnetic current corresponds to the critical current of the superconductor is sufficient to obtain a highly drifting magnet. The discharging voltage applied to the magnet would be 0.01 V in this case. The magnet current must obviously be considerably less than the critical current of the superconductor. If the magnet current is excessively low, the number of magnet windings required to achieve the required field would be excessively high, making it unacceptably large and expensive.

The determination of the correct magnet current is further aggravated in that the maximum voltage drop of the superconductor per centimeter that still prevents the overall magnet from drifting is sufficiently small that it can no longer be distinguished from the noise. The voltage drop across a superconducting magnet through which an operating current flows, and its magnetic field drift, cannot therefore be derived from a measurement on a short superconducting piece through which a magnetic flux flows. Maximum resolution voltage measurement over the entire conductor length wound on the coil body is also not possible.

In an alternative method, the superconductor to be tested is installed in an existing series-produced magnet. In this case, the conductor could be tested under NMR conditions, however, with two decisive limitations. First, the conductor dimension (conductor cross-section) of the series-produced magnet is used, which means that the new conductor type cannot bear a higher load than the standard conductor from the series-produced magnet. The higher potential of the new conductor can therefore not be tested. Secondly, if the conductor cross-section of the new conductor type is smaller, the conductor can carry a higher current density, however, the construction of the coil body of the series-produced magnet must be completely changed and adjusted to the new conductor dimension which would involve high constructive effort and expense. If the conductor does not meet the expectations and would be excessively loaded in the series-produced magnet, this magnet could not be delivered.

It is the underlying purpose of the present invention to test the NMR capability of a new superconductor type with NMR sensitivity in a series-produced NMR magnet without additional effort and little risk of having to replace the tested superconductor, i.e. having to repair the series-produced magnet. Towards this end, the new superconductor type to be tested, which should have e.g. a higher current carrying capacity than the standard superconductor, must have the same dimensions as the conductor being replaced in the series-produced magnet. The method allows testing of the new superconductor under increased current load or current density load compared to the series-produced magnet with simultaneous control of the magnetic field stability (magnetic field drift) at the NMR level. The superconductor test can be performed in a conventional series-produced magnet provided with an additional superconducting switch: the construction of the coil bodies remains unchanged since the conductor dimensions are the same. After the test, the magnet including new superconductor type can be delivered and operated according to specifications. Even though the new conductor type does not meet the increased expectations, the magnet may be delivered as long as the conductor is not worse than the standard conductor conventionally used in series-produced magnets.

SUMMARY OF THE INVENTION

The above-described object is achieved by a method for testing a new superconducting wire through charging a magnet coil configuration which is superconductingly short-circuited during operation via a superconducting main switch, and generates at an operating current $I_0$ in its center and a homogeneous and temporally stable magnetic field $B_0$ extending in a z direction, and comprising at least one first and one second partial region, wherein at least the first partial region can be separately superconductingly short-circuited via an additional superconducting switch, and wherein the first partial region contains the new superconducting wire to be tested instead of a standard wire, the method comprising the following steps:

(a) determining an excess current $\Delta I^{(1)*}$ which is adjusted to the superconducting wire to be tested and is to be set in the first partial region, to produce a current of $I^{(1)*}=I_0+\Delta I^{(1)*}$ above the operating current $I_0$;

(b) calculating a current strength value $I_1$ through the entire magnet coil configuration, at which the additional switch shall be closed across the first partial region, and a second current strength value $I_2$ of the second partial region which cannot be short-circuited with the additional switch, and at which the main switch shall be closed, such that a current distribution of $I^{(1)*}=I_1+\Delta I^{(1)}$ and $I^{(2)}=I_2=I_1+\Delta I^{(2)}$ is obtained after reaching $I_2$ in the second partial region, taking into consideration the mutual inductance between the two partial regions, and having the desired magnetic field $B_0$;

(c) charging the magnet coil configuration to a current $I_1$ with open main switch and additional switch;

(d) closing the additional switch when $I_1$ has been reached;

(e) continued charging of the magnet coil configuration to $I_2$ while the additional switch is closed and the main switch is open;

(f) closing the main switch when $I_2$ has been reached, wherein $I_1$ is reached prior to $I_2$;

(g) measuring the temporal magnetic field change (drift) using an NMR sample in the center of the magnet coil configuration for characterizing the new superconducting wire.

The central idea of the invention is to subdivide the magnet coil configuration into at least one first and one second partial region. A superconducting wire is wound in the first partial region whose NMR capability shall be tested under increased current load compared to the operating current of the standard magnet. With the inventive method, a non-vanishing current difference of $\Delta I^{(2)}-\Delta I^{(1)}$ is obtained between the two partial regions after the charging process, which permits setting of a higher current load in the superconductor of the first partial region to be tested, and at the same time does not subject the standard superconductors in the second partial region of the magnet coil configuration to a higher current than in the standard series-produced magnet. After performance of the inventive method, the temporal field stability of the magnet coil configuration can be tested by measuring the NMR signal. After successful testing of the superconductor, the magnet coil configuration may be charged to the standard current at the customer's location, thereby obtaining the specified magnetic field with open additional switch and without excess current in the first partial region which can be superconductingly short-circuited, since the superconductor to be tested has the same dimensions as the standard superconductor which it replaces. The tested superconductor may remain in the magnet after the test, and the magnet can be installed at the customer's location without taking additional measures. If the superconductor loaded with an increased current in the first partial region does not pass the test, i.e. the magnet coil configuration does not meet the desired drift criterion, the magnet may still be delivered as long as the standard current of the magnet coil configuration in the superconductor to be tested does not produce an increased drift. Only one single power supply is required for charging the overall magnet coil configuration in performing the test in accordance with the invention, which saves cost.

One variant of the inventive method is advantageous, wherein after step (f), the connection between the power supply and the magnet coil configuration is separated. This frees the power supply and reduces the costs for operating the magnet coil configuration.

One method variant is particularly preferred, wherein the magnet coil configuration comprises a supplementary switch for separately superconductingly short-circuiting the second partial region, which cannot be short-circuited by the additional switch. This renders handling of the magnet coil configuration more flexible during charging, for example through free selection of the partial region which is to be initially short-circuited.

In one advantageous design of this variant, the supplementary switch is closed after step (f). This reduces the heat input into the cooling medium, i.a. into the helium (He) bath, thereby reducing the He consumption, since keeping the switch open is usually associated with heat input through the heating means.

In another preferred method variant $M/L^{(1)}>10^{-4}$, wherein M describes the inductive coupling between the two superconducting partial regions and $L^{(1)}$ describes the self inductance of the first partial region which can be superconductingly short-circuited. If the factor is large enough, the current change $\Delta I^{(2)}$ in the second partial region may be kept small. This reduces the time for performing the method and keeps the current in the second partial region close to the operating current of the series-produced magnet. At the same time, the load in the second partial region of the magnet coil configuration remains close to that of the standard operating state.

In one particularly preferred variant of the inventive method, the magnet coil configuration is divided into two partial regions such that the additional currents $\Delta I^{(1)}$ and $\Delta I^{(2)}$ in the two partial regions produce minimum field changes compared to standard operation of the magnet coil configuration. If possible, the second partial region should not be subjected to an excess field in order to ensure that the conductor used therein is not subjected to a higher load than during standard operation of the series-produced magnet. At the same time, when $I_2$ has been reached, the first partial region which is additionally superconductingly short-circuited should be within a magnetic field range which corresponds to that of standard operation of the series-produced magnet in order to test the superconducting wire, which is subjected to a higher current load after step (f) than during standard operation, in a magnetic field which is preferably not reduced compared to standard operation. In order to ensure this, the field lifts ($b^{(1)}$, $b^{(2)}$) and the additional currents ($\Delta I^{(1)}$, $\Delta I^{(2)}$) of the two partial regions should approximately adhere to the following relation: $|b^{(1)}/b^{(2)}|=|\Delta I^{(1)}/\Delta I^{(2)}|$. This requirement ensures that the field changes in the two partial regions have the same magnitudes: $B^{(1)}=b^{(1)}*\Delta I^{(1)}=-B^{(2)}=-(b^{(2)}*\Delta I^{(2)})$ and the magnetic field in the center of the magnet coil configuration remains unchanged after step (f).

In an advantageous method variant, $I_1>I_2$ during operation when the additional switch is closed. In this case, an excess current can be induced in the first partial region when the first partial region of the magnet coil configuration is short-circuited and the first and second partial regions are positively inductively coupled.

In an alternative method variant, $I_1<I_2$ during operation when the additional switch is closed. In this case, an excess current can be induced in the first partial region when the first partial region of the magnet coil configuration is short-circuited and the first and second partial regions are negatively inductively coupled.

In a further preferred variant of the inventive method, the position of the first partial region provided with an additional switch is selected such that the time constant which determines the decay behavior of the magnetic field in the center of the magnet coil configuration permits sensitive drift measurement. The first partial region may e.g. be selected such that the resistivity in this first partial region causes a magnetic field drift which is 10 times larger when the first partial region is short-circuited than if it is not superconductingly short-circuited. In order to achieve such an increase, the partial regions must be designed in such a manner that the term $(L^{(1)}*L^{(2)}-M)$ is minimum.

Alternatively, the two partial regions may be selected such that the drift resulting from the short-circuited, possibly resistive first partial region is not amplified (or with a factor of 1). In this case, the drift of the overall magnet configuration is the same irrespective of whether or not the first partial region is short-circuited. This reduces the risk that a small resistivity in the tested superconductor of the first partial region is amplified into a drift of the magnet coil configuration which is beyond the specification of the series-produced magnet.

In an advantageous method variant, the superconducting additional switch is used over the second partial region of the magnet coil configuration which, by definition, contains no superconductor to be tested. In this case, the first partial region provided with the superconductor to be tested may be charged to the desired target current using the power supply. Excess load of the superconductor of the second partial region beyond its standard load is reliably prevented by closing the additional switch over the second partial region in due time.

This method variant design is particularly preferred when the two partial regions are inductively decoupled. Setting of the current in the superconductor to be tested is thereby greatly facilitated. It is not necessary to solve coupled differential equations in order to consider the coupling for determining the additional currents.

In one particularly preferred variant of the inventive method, the magnet coil configuration comprises at least one further third partial region in addition to the first and second partial regions, which can be separately superconductingly short-circuited using an additional switch. The third partial region renders the magnet coil configuration more flexible. The additional partial region may e.g. be used to test a further superconducting wire of a different conductor type in the magnet coil configuration. A superconductor of $Nb_3Sn$ material may e.g. be tested in the first partial region and a superconductor of NbTi may be tested in the new partial region, or the field homogeneity in the center of the magnet coil configuration at the location of the NMR sample can be improved by the third partial region.

Further advantages of the invention can be extracted from the detailed description and the drawing. The features mentioned above and below may be used in accordance with the invention either individually or collectively in arbitrary combination. The embodiments shown and described are not to be understood as exhaustive enumeration but have exemplary character for describing the invention.

DESCRIPTION OF THE PREFERRED EMBODIMENT

NMR (nuclear magnetic resonance) spectroscopy methods must meet extremely high demands with regard to the temporal stability of the measured resonance frequency and therefore the temporal stability of the magnetic field of the superconducting magnet coil configuration having the sample to be investigated in its center, whose resonance frequency is proportional to the magnetic field. The specified temporal frequency stability for a 18.9 Tesla magnet with a resonance frequency for hydrogen nuclei of 800 MHz is e.g. 8 Hz/h.

In order to obtain this stability, the coils of these NMR magnets must be wound with superconducting wire and be operated in the short-circuit mode ("persistent mode"). In order to guarantee this high temporal stability, the superconducting wires (superconductors) in the magnetic field of the magnet coil configuration may not be excessively loaded. The magnet current for the magnetic field in which the superconductor is operating, must not be excessively large. This means, that the critical current of the superconductor, i.e. the current at which the superconducting state changes as per definition to the normally conducting state in a given external magnetic field, must be considerably higher than the operating current of the magnet. Since the superconductor is physically described by the current density (current per conductor cross-sectional surface) one could use a conductor of maximum thickness to minimize the current density in the superconductor at the given operating current of the magnet. One would thereby obtain a very large magnet with all associated disadvantages: high cost, high energy which must be discharged from the magnet in case of sudden transition from the superconducting in the normally conducting state, large forces, etc. For this reason, the superconductor must be loaded with a maximum current density, while thereby preventing the associated resistivity from having an excessive influence on the temporal stability of the magnetic field.

Figure 1:
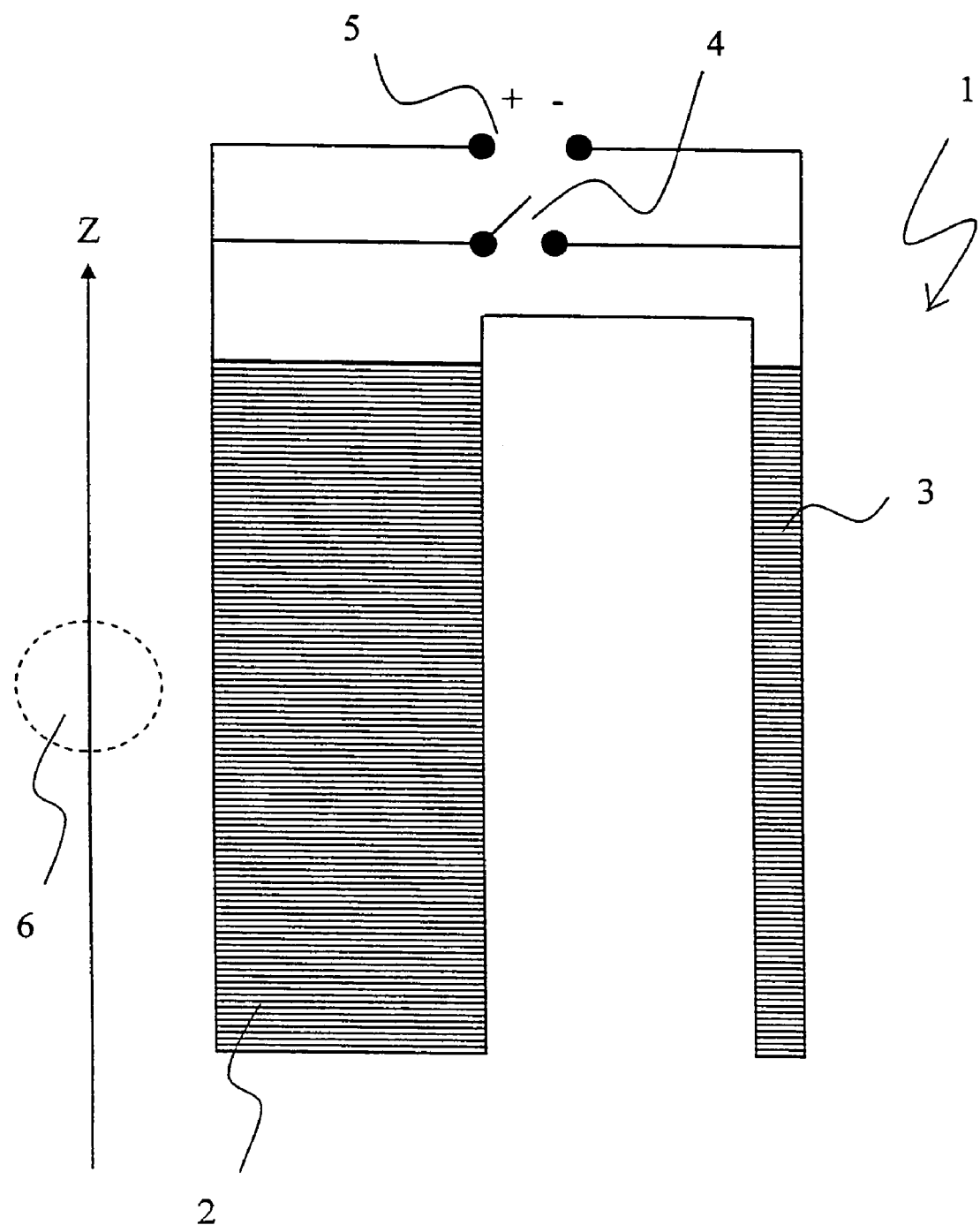
FIG. 1 shows a magnet coil configuration with shielding section and residual magnet according to prior art.

FIG. 1 shows a cross-section of one half of a magnet coil configuration 1 as used in conventional NMR spectroscopy. The magnet coil configuration 1 consists substantially of a main field part 2 and a shielding part 3. The main field part 2 and the shielding part 3 are conventionally connected in series during operation and can be short-circuited using a common superconducting main switch 4. The main field part 2 and the shielding part 3 are loaded with a uniform current via a common power supply 5.

This conventional magnet configuration 1 and its operation are disadvantageous since none of the regions in the main field part 2 or shielding part 3 may be loaded with a higher current (or a higher current density) without loading all other regions of the magnet coil configuration with this higher current. It is thereby not possible to locally test a new type of superconductor in a certain field region in a series-produced magnet. An alternative method for testing a new type of superconductor in a series-produced magnet under increased current density load would be the use of a superconductor which is thinner compared to the standard conductor. The thinner superconductor has a higher current density than the series conductor at a given magnetic current. This method, however, would require large constructive effort and high costs, since the entire coil construction must be adjusted to the thinner conductor. A very simple method is described below for loading and testing a new superconductor, having the same conductor dimensions as the standard conductor, in a series-produced magnet with an excess current without adjusting the magnet coil configuration to the new conductor dimension, and, most importantly, without overloading the other superconductors in the magnet coil configuration.

Figure 2:
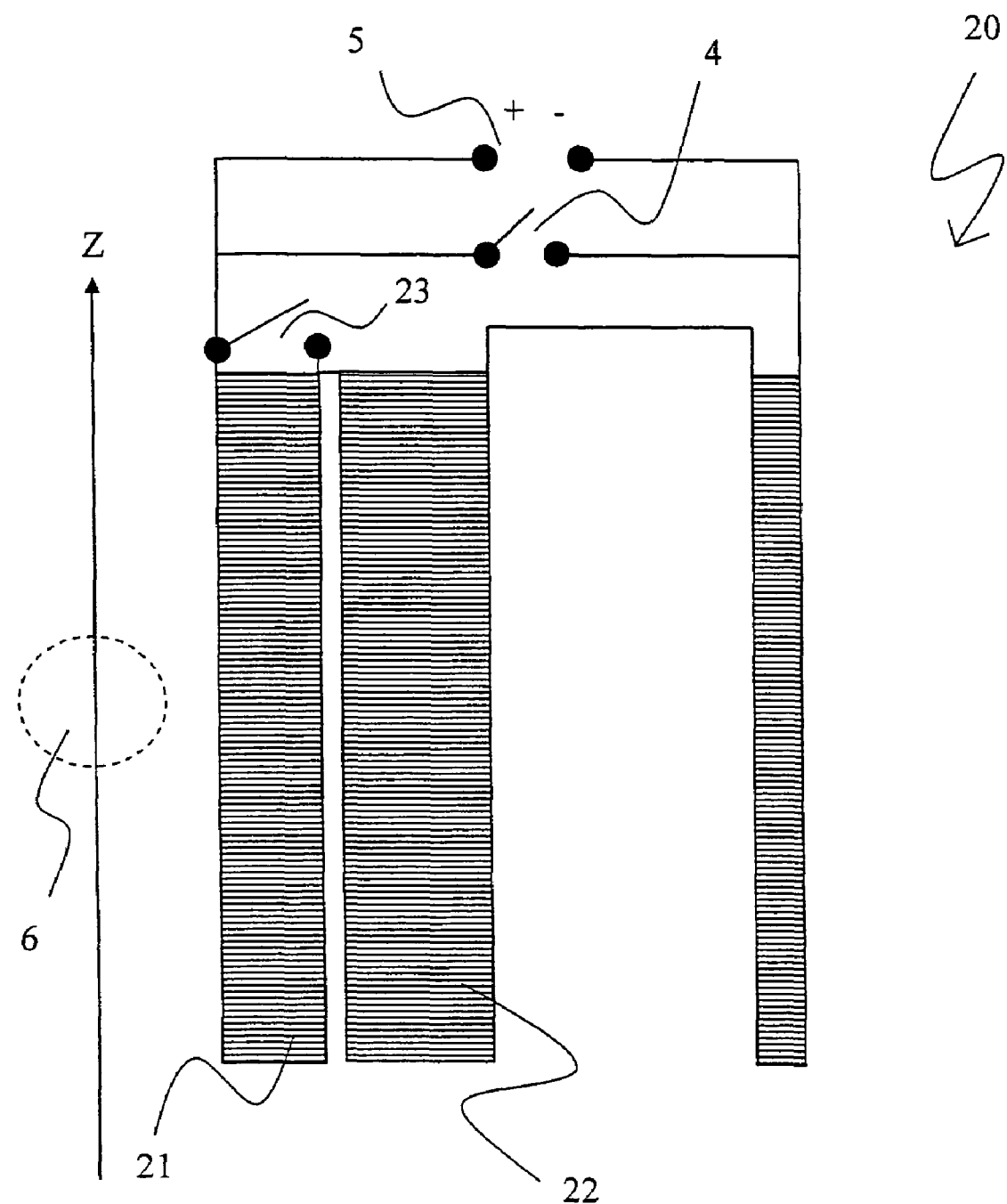
FIG. 2 shows a magnet coil configuration with a first and a second partial region with additional switch and main switch for performing the inventive method, wherein the first partial region alone contains the superconductor winding to be tested.

The inventive teaching greatly facilitates the procedure. FIG. 2 shows a suitable structure for performing the inventive method.

A magnet coil configuration 20 substantially comprises a first partial region 21 which contains the superconductor to be tested, and a second partial region 22 which contains the remaining part of the magnet coil configuration 20. (This represents a possible division. Other divisions of a magnet coil configuration 20 into partial regions are, in principle, possible in accordance with the invention. A first partial region may e.g. also comprise the superconductor to be tested and parts of the residual magnet). The first partial region 21 and the second partial region 22 are connected in series and may be charged using a power supply 5. The overall magnet coil configuration 20 can be superconductingly short-circuited using a main switch 4. The first partial region 21 may additionally be separately superconductingly short-circuited using an additional switch 23.

The basic idea of the inventive method consists in charging the first and second partial regions 21, 22 with different current strengths $I^{(1)}$, $I^{(2)}$ which is fundamentally possible using the additional switch. Due to the different current flows in the two partial regions 21, 22, the current in the first partial region 21 may be considerably higher than in the second partial region without producing a field which exceeds the load limit of the conductor in the second partial region 22.

The different currents are fundamentally adjusted through charging the overall magnet coil configuration 20 and thereby also the first partial region 21 to a current $I_1$, short-circuiting the first partial region 21 with the additional switch 23 and continued charging to a current $I_2$ in the second partial region 22. Charging to a current $I_2$ may be continued by either reducing (discharging) or increasing the current flow.

Due to typical coupling effects, the coupling behavior of the two partial regions must be taken into consideration in the determination of the charging currents. If the current in the second partial region 22 is changed while the first partial region 21 is short-circuited, a response current is generally induced in the first partial region, i.e. the current in the short-circuited first partial region changes. This coupling can be calculated. In general, a given magnetic field $B_0$ should also be established.

The charging process is described in detail below:

1. The excess current $\Delta I^{(1)*}$ is initially determined for the first partial region 21. It must produce a current $I^{(1)*} = I_0 + \Delta I^{(1)*}$ which is above the standard operating current $I_0$ of the standard magnet coil configuration. This method is typically designed to test a new superconductor in the first partial region 21 which has a higher current compatibility, i.e. higher critical current density with the same conductor dimensions as the standard magnet coil configuration and identical magnetic field. The excess current must therefore be adjusted to the critical current density of the superconductor to be tested.

2. When the excess target current is known, the further method parameters must be determined. Charging is generally performed with a power supply 5 current strength that increases linearly with time, such that different times must be determined at which the additional switches 23 and main switches 4 must be closed in order to adjust particular current strengths in the partial regions 21, 22. Through closing the additional switch 23, the current in the first partial region is fixed to the value $I_1$, apart from induction influences. The time must be calculated from which charging of the magnet coil configuration 20 with short-circuited first partial region 21 must be continued or, if the target current is exceeded, discharged in such a manner that when the target current $I_2$ has been reached, a current $I^{(1)*}$ is present in the first partial region 21 (the partial region with the superconductor to be tested) which is above the standard current of the magnet coil configuration 20. At the same time, the current and the magnetic field in the second partial region must not or only slightly exceed the standard load of this second partial region. Moreover, the predetermined target field $B_0$ must be achieved with the respective currents in the partial regions 21, 22. Two different situations may thereby occur:

First case: the coupling inductance between the first partial region 21 and the second partial region 22 of the magnet coil configuration 20 is positive. If the first partial region 21 (with the superconductor to be tested) is short-circuited at the right time and the magnet coil configuration 20 is discharged, a positive additional current is induced in the short-circuited first partial region 21 which increases its current load such that, when the final field $B_0$ has been reached, the desired additional current and therefore the desired increased conductor load is given in the first partial region without overloading the second partial region.

Second case: The coupling inductance between the first partial region 21 and the second partial region 22 of the magnet coil configuration 20 is negative. When the first partial region 21 (with the superconductor to be tested) is short-circuited at the right time and the magnet coil configuration 20 is charged, a positive additional current is induced in the short-circuited first partial region 21 which increases its current load such that when the final field $B_0$ has been reached, the desired additional current and therefore the desired increased conductor load is given in the first partial region without overloading the second partial region.

In both cases, the $B_0$ field lifts of the two partial regions $b_0^{(1)}$, $b_0^{(2)}$ and the self and mutual inductances of the two partial regions must be introduced into the calculation of $I_1$ and $I_2$. This information can be calculated from the coil geometry.

3. The magnet coil configuration 20 is charged to a current $I_1$. The main switch 4 and additional switch 23 are thereby open.

4. When $I_1$ has been reached, the additional switch 23 is closed.

5. Continued charging of the magnet coil configuration 20 with closed additional switch 23 and open main switch 4, wherein continued charging of the magnet coil configuration 20 may also be discharging.

6. When the final field has been reached, which is the case when $I_2$ is reached in the second partial region 22, the main switch 4 is closed across the entire magnet coil configuration 20 (i.e. the first and second partial region). At this time, different currents flow through the first and second partial regions, namely $I^{(1)}=I_1+\Delta I^{(1)*}$ and $I^{(2)}=I_1+\Delta I^{(2)}$, wherein $I_1$ is the current at which the additional switch was closed. The additional current $\Delta I^{(1)*}$ is thereby generated exclusively through inductive coupling with the second partial region 22, and the additional current $\Delta I^{(2)}$ can be directly controlled by the power supply 5.

7. Measuring the temporal field change using an NMR sample in the center of the magnet coil configuration 6.

A calculation method for determining the charging parameters of an inventive charging method is shown below. The calculation is described using typical proceedings and can be correspondingly generalized.

The magnet coil configuration is divided into two partial regions, wherein the first partial region is superconductingly short-circuited using an additional switch after the target field $B_0$ or target current $I_0$ has been reached. The magnet coil configuration is then discharged for a time period $\Delta t$ at a voltage $U_0$ ($U_0<0$). This time period $\Delta t$ must now be determined such that when the main switch is closed (i.e. after lapse of $\Delta t$) the required excess current $\Delta I^{(1)*}$ or the overall current $I^{(1)}=I_0+\Delta I^{(1)*}$ is present in the first partial region. $I_0$ thereby corresponds to the current $I_1$, specified by the method, at which the additional switch is closed over the first partial region. The current present after $\Delta t$ corresponds to $I_2$, as specified by the method. The calculation also requires that the superconductor experiences no excess field in the second partial region.

Terms:

$U_0$=charging or discharging voltage after short-circuiting the first partial region $I_0$=standard magnet current of the magnet configuration $\Delta I^{(1)*}$=excess current in the first partial region that contains the superconductor to be tested $L^{(1,2)}$=self inductances of the partial regions 1 and 2

$M$=mutual inductance between the two partial regions $b_0^{(1,2)}=B_0$ field lifts ($B_0$ field per ampere) of the two partial regions 1 and 2

$\Delta B_0^*=B_0$ additional field due to additional currents $\Delta I^{(1)*}$, $\Delta I^{(2)}$.

The temporal developments of the two partial currents $I^{(1)}$, $I^{(2)}$ in the two partial regions after closing the additional switch are given by the coupled differential equations:

$$L^{(1)}*dI^{(1)}/dt+M*dI^{(2)}/dt=0$$

$$M*dI^{(1)}/dt+L^{(2)}*dI^{(2)}/dt=U_0$$

After lapse of a time interval $\Delta t$ after closing the additional switch, the following additional currents are present:

$$\Delta I^{(1)}_{(\Delta t)}=-U_0*\Delta t*M/(L^{(1)}*L^{(2)}-M^2)$$

$$\Delta I^{(2)}_{(\Delta t)}=U_0*\Delta t*L^{(1)}/(L^{(1)}*L^{(2)}-M^2)$$

The temporal development of the current in the first partial region is:

$$I^{(1)}_{(\Delta t)}=I_0+\Delta I^{(1)}_{(\Delta t)}=I_0-U_0*\Delta t*M/(L^{(1)}*L^{(2)}-M^2)$$

wherein the sign of the current change is determined by the sign of the negative discharge voltage.

The desired excess current in the first partial region determines the time interval $\Delta t$ during which the additional switch must remain closed:

$$\Delta I^{(1)}_{(\Delta t)}=\Delta I^{(1)*}$$

from which follows:

$$\Delta t=(\Delta I^{(1)*})*(-1/U_0)*(L^{(1)}*L^{(2)}-M^2)/M$$

The (power supply) current at which the main switch must be closed is:

$$I_2=I_0+\Delta I^{(2)}_{(\Delta t)}$$

The resulting additional field is:

$$\Delta B_0^*=(b_0^{(1)}*\Delta I^{(1)*}_{(\Delta t)}+b_0^{(2)}*\Delta I^{(2)}_{(\Delta t)}).$$

Introduction of the partial currents and requirement with respect to $\Delta t$ into this equation yields:

$$\Delta B_0^*=\Delta I^{(1)**}*(b_0^{(1)}-b_0^{(2)}*L^{(1)}/M).$$

In order to prevent superconductor overload in the second partial region of the magnet coil configuration, the field change ($\Delta B_0^*$) may be required to be zero or negative. Since $\Delta I^{(1)*}>0$ always applies for the superconductor test: $b_0^{(1)}/b_0^{(2)} \leq L^{(1)}/M$.

The temporal development of the partial current in the first, additionally superconductingly short-circuited partial region is calculated in the following paragraph after closing the main switch, and a requirement with respect to the first partial region to be short-circuited is derived which permits sensitive measurement of the resistance in this partial region, i.e. in the superconductor to be tested.

If we add a resistance (R) to the above introduced differential equation for describing the current change in the first partial region and assume that there is no resistance in the second partial region, the differential equations are:

$$L^{(1)}*dI^{(1)}/dt+M*dI^{(2)}/dt+R*I^{(1)}=0$$

$$M*dI^{(1)}/dt+L^{(2)}*dI^{(2)}/dt=0$$

These may be changed to:

$$dI^{(1)}/dt=[-R*L^{(2)}/(L^{(1)}*L^{(2)}-M^2)]*I^{(1)}$$

$$dI^{(2)}/dt=[R*M/(L^{(1)}*L^{(2)}-M^2)]*I^{(1)}$$

The temporal development of the current in the first partial region is described by the following equation:

$$I^{(1)}_{(t)}=I^{(1)}_{(0)}*\exp[-t*R*L^{(2)}/(L^{(1)}*L^{(2)}-M^2)]$$

Considering the field lifts of the two partial regions, the temporal change of the magnetic field in the center of the magnet coil configuration can be calculated, i.e. the magnetic field drift at the location of the NMR sample:

$$dB_{0(t)}/dt=(b_0^{(1)}*dI^{(1)}/dt+b_0^{(2)}*dI^{(2)}/dt).$$

Introduction of the temporal changes of the partial currents ($dI^{(1)}/dt$ and $dI^{(2)}/dt$) into this equation yields:

$$dB_{0(t)}/dt=R/(L^{(1)}*L^{(2)}-M^2)*(b_0^{(2)}*M-b_0^{(1)}*L^{(2)})*I^{(1)}_{(t)}$$

Moreover, considering the very long time constants with which the magnetic fields of superconducting NMR magnets decay ($10^{11}$ sec), the current in the first partial region can be regarded as temporally constant, which produces the following temporally constant value for the temporal change of the magnetic field:

$$dB_{0(t)}/dt=[R/(L^{(1)}*L^{(2)}-M^2)]*(b_0^{(2)}*M-b_0^{(1)}*L^{(2)})*I^{(1)}_{(0)}$$

The temporal decay of the magnetic field (the magnetic field drift) of the magnet coil configuration with given resistance in the superconductor (R) is thereby determined by values which depend only on the selected geometry of the superconductingly short-circuited first partial region. It is thereby e.g. possible through suitable selection of this first partial region to ensure that the field drift is large and easy to detect by selecting a minimum value for the term $(L^{(1)}*L^{(2)}-M^2)$.

The invention concerns a method for testing a new superconducting wire through charging an actively shielded magnet coil configuration (20) which comprises a first partial region (21) which can be superconductingly short-circuited using an additional switch (23). A superconductor to be tested under increased current load is used in this first partial region (21), thereby preventing the superconductor from being subjected to this increased current load in the second partial region (22). Operating currents are determined for each partial region (21, 22) with the desired excess current in the first partial region, wherein the overall field $B_0$ only slightly differs from the standard operating field of the magnet coil configuration. These operating currents are adjusted through initial charging of the overall magnet coil configuration (20), thereby taking into consideration the inductive coupling between the partial regions (21, 22), and after closing of the additional switch (23), through continued charging or discharging processes only in the second partial region (22). This permits inexpensive testing of a superconductor under NMR conditions in a series-produced NMR magnet.

We claim:

1. A method for testing a new superconductor by charging an actively shielded magnet coil configuration that is short-circuited during operation via a superconducting main switch, the magnet coil configuration having a standard desired current in superconducting persistent mode, wherein the magnet coil configuration has at least one first and one second partial region, the method comprising steps of:
    a) replacing a standard superconductor in the first partial region with the new superconductor, the new superconductor having a current carrying capacity in this first partial region which is somewhat higher than that of the standard superconductor;
    b) charging and superconducting short-circuiting the first and the second partial regions in such a manner that, at an end of a charging procedure, a non-negligible current difference is established between the first and second partial regions, with a higher current being present in the new superconductor, wherein the standard desired current of the magnet coil configuration in the second partial region is not exceeded; and
    c) measuring a time change of a magnetic field drift using an NMR probe in a center of the magnet coil configuration to characterize the new superconductor.

2. The method of claim 1, wherein at least the first partial region can be separately, superconductingly short-circuited via an additional superconducting switch, the method further comprising the steps, performed prior to step c), of:
    d) determining an excess current $\Delta I^{(1)}*$ which is adjusted to the new superconductor and that is to be set in the first partial region to produce a current of $I^{(1)}*=I_0+\Delta I^{(1)}*$ above an operating current $I_0$;
    e) calculating a current strength value $I_1$, through an entire magnet coil configuration, at which the additional switch is to be closed across the first partial region, and a second current strength value $I_2$ of the second partial region, which cannot be short-circuited with the additional switch, at which the main switch is to be closed, such that a current distribution of $I^{(1)}*=I_1+\Delta I^{(1)}$ and $I^{(2)}=I_2=I_1+\Delta I^{(2)}$ is obtained after reaching $I_2$ in the second partial region, taking into consideration a mutual inductance between the first and second partial regions, while achieving a desired magnetic field $B_0$;
    f) charging the magnet coil configuration to the current $I_1$ with the main switch and the additional switch being open;
    g) closing the additional switch when $I_1$ has been reached;
    h) continuing charging the magnet coil configuration to $I_2$ with the additional switch closed and the main switch open; and
    i) closing the main switch when $I_2$ has been reached, wherein $I_1$ is reached prior to $I_2$.

3. The method of claim 2, wherein following step i), a connection between a power supply and the magnet coil configuration is separated.

4. The method of claim 2, wherein the magnet coil configuration comprises a supplementary switch for separately superconductingly short-circuiting the second partial region, which cannot be short-circuited by the additional switch.

5. The method of claim 4, wherein the supplementary switch is closed following step i).

6. The method of claim 2, wherein the magnet coil configuration is divided into the first and second partial regions such that the additional currents $\Delta I^{(1)}$ and $\Delta I^{(2)}$ in the two partial regions produce minimum field changes compared to a standard operation of the magnet coil configuration, wherein field lifts $b^{(1)}$, $b^{(2)}$ and the additional currents $\Delta I^{(1)}$, $\Delta I^{(2)}$ of the first and second partial regions approximately satisfy the following relationship: $|b^{(1)}/b^{(2)}|=|\Delta I^{(1)}/\Delta I^{(2)}|$.

7. The method of claim 2, wherein, in addition to the first and second partial regions, the magnet coil configuration comprises at least one third partial region which can be separately superconductingly short-circuited using a further additional switch.

8. The method of claim 7, wherein the steps d) through i) are repeated between closing of the additional switch and closing of the main switch, wherein the third partial region and the further additional switch for superconductingly short-circuiting the third partial region are used instead of the first partial region and the additional switch for superconductingly short-circuiting the first partial region.

9. The method of claim 8, wherein the first partial region is subjected to an excess current, and the third partial region increases a homogeneity in a center of the magnet coil configuration.

10. The method of claim 8, wherein the first partial region is subjected to an excess current in a first superconductor to be tested and the third partial region is subjected to a different current excess in a second superconductor to be tested.

11. The method of claim 1, wherein $M/L^{(1)}>10^{-4}$, wherein M is a mutual inductance between the two partial regions and $L^{(1)}$ is a self inductance of the first partial region.

12. The method of claim 1, wherein the first and second partial regions are selected such that an inductive coupling between them is positive.

13. The method of claim 1, wherein the first and second partial regions are selected such that an inductive coupling between them is negative.

14. The method of claim 1, wherein the first and second partial regions are inductively decoupled.

15. The method of claim 1, wherein the drift derived from the first partial region is increased by a factor of at least 2 through short-circuiting the first partial region.

16. The method of claim 1, wherein a division into the first and second partial regions is effected in such a manner that the drift remains unchanged when the first partial region is short-circuited.

* * * * *